United States Patent
Hsiao et al.

(10) Patent No.: US 9,287,461 B2
(45) Date of Patent: Mar. 15, 2016

(54) LIGHT-EMITTING DIODE AND METHOD FOR MANUFACTURING THE SAME

(71) Applicant: Lextar Electronics Corporation, Hsinchu (TW)

(72) Inventors: Chia-Lin Hsiao, Taichung (TW); Nai-Wei Hsu, Tainan (TW); Te-Chung Wang, Taichung (TW); Tsung-Yu Yang, Zhubei (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/054,303

(22) Filed: Oct. 15, 2013

(65) Prior Publication Data

US 2014/0225150 A1    Aug. 14, 2014

(30) Foreign Application Priority Data

Feb. 8, 2013    (TW) .............................. 102105423 A

(51) Int. Cl.
| | |
|---|---|
| H01L 33/38 | (2010.01) |
| H01L 33/42 | (2010.01) |
| H01L 33/14 | (2010.01) |

(52) U.S. Cl.
CPC ................ *H01L 33/42* (2013.01); *H01L 33/14* (2013.01); *H01L 33/38* (2013.01); *Y10S 977/734* (2013.01); *Y10S 977/95* (2013.01)

(58) Field of Classification Search
CPC .......... H01L 33/32; H01L 33/42; H01L 33/38
USPC ..................................... 257/99, 103, E33.065
See application file for complete search history.

(56) References Cited

U.S. PATENT DOCUMENTS

| | | | | |
|---|---|---|---|---|
| 6,078,064 | A | * | 6/2000 | Ming-Jiunn et al. .......... 257/103 |
| 6,512,248 | B1 | * | 1/2003 | Takeuchi et al. ................. 257/81 |
| 6,693,352 | B1 | | 2/2004 | Huang et al. |
| 7,528,417 | B2 | * | 5/2009 | Takeuchi et al. ................. 257/96 |
| 7,834,373 | B2 | * | 11/2010 | Feng et al. ....................... 257/99 |
| 7,998,771 | B2 | | 8/2011 | Bae |
| 8,664,684 | B2 | * | 3/2014 | Schubert .......................... 257/99 |
| 2008/0224165 | A1 | * | 9/2008 | Seong et al. ..................... 257/99 |
| 2008/0303055 | A1 | * | 12/2008 | Seong ............................ 257/103 |
| 2011/0168972 | A1 | | 7/2011 | Kwak et al. |
| 2012/0097918 | A1 | | 4/2012 | Yu et al. |

FOREIGN PATENT DOCUMENTS

TW    M284073    12/2005

OTHER PUBLICATIONS

L. M. Chang, Shoou-Jinn Chang, et al., "Enhanced Current Spreading for GaN-Based Side-View LEDs by Adding an Metallic Stripe Across the Long Side of the Chip", IEEE Photonics Technology Letters, vol. 24, No. 16, Aug. 15, 2012.

* cited by examiner

*Primary Examiner* — John C Ingham
(74) *Attorney, Agent, or Firm* — Moser Taboada

(57) ABSTRACT

The disclosure provides a light-emitting diode and a method for manufacturing the same. The light-emitting diode comprises a N-type metal electrode, a N-type semiconductor layer contacted with the N-type metal electrode, a P-type semiconductor layer, a light-emitting layer interposed between the N-type semiconductor layer and the P-type semiconductor layer, a low-contact-resistance material layer positioned on the P-type semiconductor layer, a transparent conductive layer covered the low-contact-resistance material layer and the P-type semiconductor layer, and a P-type metal electrode positioned on the transparent conductive layer.

9 Claims, 21 Drawing Sheets

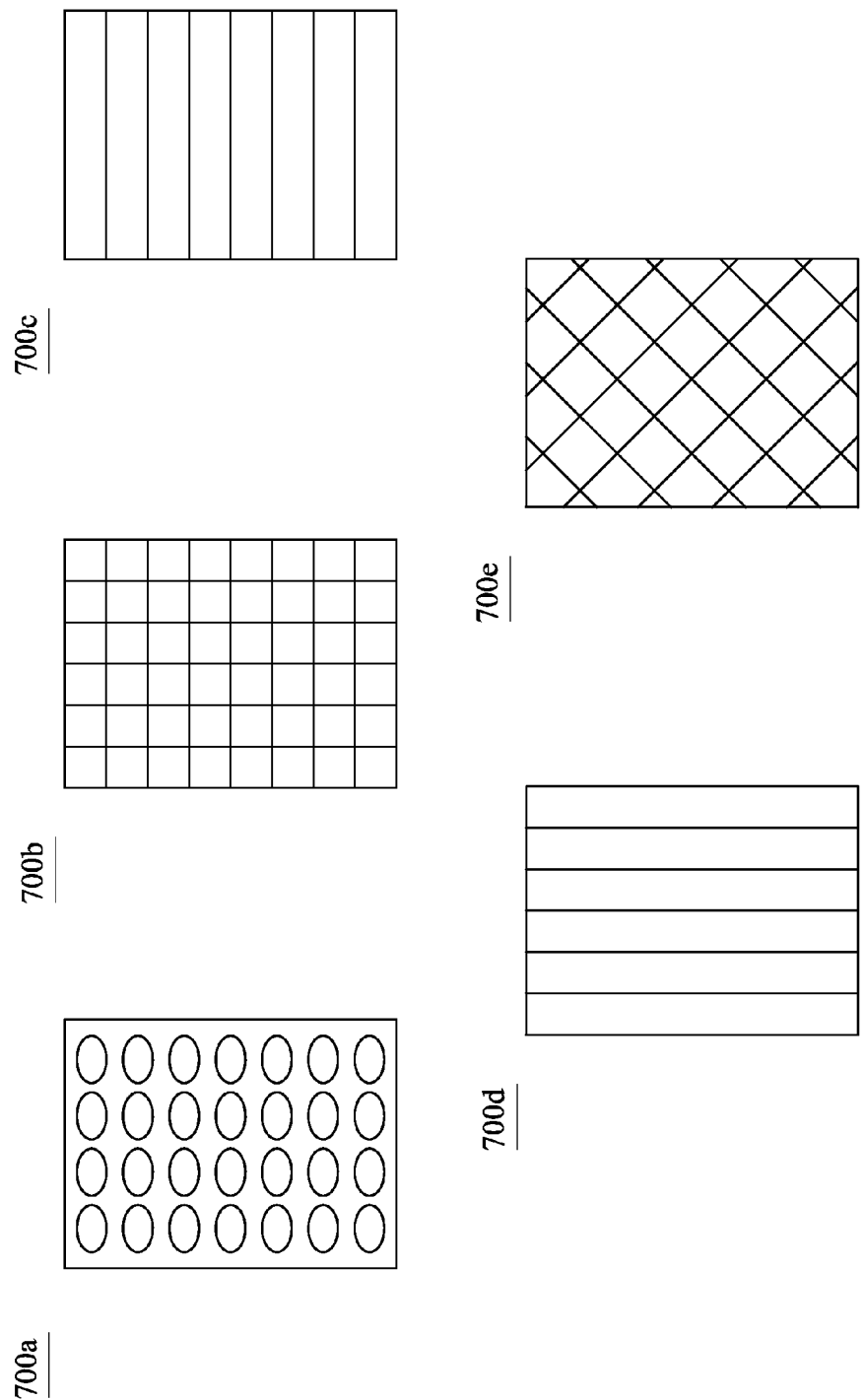

LIGHT-EMITTING DIODE AND METHOD FOR MANUFACTURING THE SAME

RELATED APPLICATIONS

This application claims priority to Taiwan Application Serial Number 102105423 filed Feb. 8, 2013, which is herein incorporated by reference.

BACKGROUND

1. Technical Field

The present disclosure relates to a light-emitting diode, and more particularly, to a light-emitting diode having a low contact resistance layer.

2. Description of Related Art

A light-emitting diode (LED) is generally formed an epitaxy structure on an insulation substrate, wherein the epitaxy structure includes a P-type metal electrode, a P-type semiconductor layer, a light-emitting layer, an N-type semiconductor layer, and an N-type metal electrode. In the LED, the insulation substrate may be sapphire. Since it is required for the P-type metal electrode and the N-type metal electrode of the LED to be formed on the same surface of the insulation layer, the current crowding easily occurs on the surface and decreases the light-emitting efficiency of the LED, so as to degrade the operation potential of the LED.

FIG. 1 is shown a cross-sectional view of a conventional light-emitting diode (LED) 100. The LED 100 includes a substrate 110, an N-type semiconductor layer 120, a light-emitting layer 130, a P-type semiconductor layer 140, a P-type metal electrode 150 and an N-type metal electrode 160. In FIG. 1, current 170 starts from the P-type metal electrode 150, and goes through the P-type semiconductor layer 140, the light-emitting layer 130 and the N-type semiconductor layer 120 to reach the N-type metal electrode 160. Since the current 170 always goes a pathway of the lowest resistance, the current crowding is apt to generate near the P-type metal electrode 150 or the N-type metal electrode 160, which decreases the light-emitting efficiency of the LED 100. As shown in FIG. 1, the current crowding occurs near the N-type metal electrode 160.

FIG. 2 is shown a cross-sectional view of a conventional LED 200 and a schematic view of a current pathway in the LED 200. The LED 200 includes a substrate 210, an N-type semiconductor layer 220, a light-emitting layer 230, a P-type semiconductor layer 240, a transparent conductive layer 250, a P-type metal electrode 260 and an N-type metal electrode 270. In FIG. 2, if the resistance of the transparent conductive layer 250 is far less than the resistance of the N-type semiconductor layer 220, the current may follow the pathway A, from the P-type metal electrode 260 to the N-type metal electrode 270, and then the current crowding occurs near the N-type metal electrode 270. If the resistance of the N-type semiconductor layer 220 is far less than the resistance of the transparent conductive layer 250, the current may follow the pathway B, from the P-type metal electrode 260 to the N-type metal electrode 270, and then the current crowding occurs near the P-type metal electrode 260.

Due to the occurrence of the current crowding, the conventional LED has higher operation potential at the P-type metal electrode or the N-type metal electrode. And in an LED, such uneven distribution of current may cause uneven distribution in color, premature saturation of light intensity, and insufficient reliability of electrical elements. Therefore, an improved LED and a method of manufacturing the same are needed to solve the aforementioned problems.

SUMMARY

The present disclosure provides a light-emitting diode having a low-contact-resistance material layer and a method for manufacturing thereof, so as to solve the problems of the prior art and achieve better performance.

One aspect of the present disclosure is to provide a light-emitting diode (LED). The LED comprises an N-type metal electrode, an N-type semiconductor layer contacting with the N-type metal electrode, a P-type semiconductor layer, a light-emitting layer sandwiched between the N-type semiconductor layer and the P-type semiconductor layer, a low-contact-resistance material layer positioned on part of the surface of the P-type semiconductor layer, a transparent conductive layer covering the low-contact-resistance material layer and the P-type semiconductor layer, and a P-type metal electrode positioned on the transparent conductive layer.

According to one embodiment of the present disclosure, the N-type semiconductor layer comprises a mesa structure having a first area and a second area, wherein the first area has a higher level than that of the second area, the light-emitting layer and the P-type semiconductor layer is formed on the first area, and the N-type metal electrode is positioned on the second area of the mesa structure.

According to one embodiment of the present disclosure, the low contact resistance layer surrounds the P-type metal electrode, or is positioned between vertical projection regions of the P-type metal electrode and the N-type metal electrode.

According to one embodiment of the present disclosure, the N-type metal electrode and the P-type metal electrode are positioned on two opposite sides of the light-emitting layer.

According to one embodiment of the present disclosure, the low-contact-resistance material layer completely or partially surrounds the P-type metal electrode.

According to one embodiment of the present disclosure, the low-contact-resistance material layer is in a round-hole pattern, a stripe pattern, a lattice pattern, or a combination thereof.

According to one embodiment of the present disclosure, the material of the low-contact-resistance material layer is graphene or a metal selected from the group comprising of nickel (Ni), gold (Au), chromium (Cr), platinum (Pt), rhodium (Rh), titanium (Ti), aluminum (Al), silver (Ag), copper (Cu) and the combinations thereof.

According to one embodiment of the present disclosure, the thickness of the low-contact-resistance material layer is in a range of 0.1 nm to 1000 nm.

According to one embodiment of the present disclosure, the LED further comprises a metal-indium contact layer positioned between the P-type semiconductor layer and the low-contact-resistance material layer, and the transparent conductive layer covers the low-contact-resistance material layer and the metal-indium contact layer.

According to one embodiment of the present disclosure, the metal-indium contact layer is an indium tin oxide (ITO) layer.

Another aspect of the present disclosure is to provide a method for manufacturing the LED. The method for manufacturing the LED comprises the following steps. A substrate is provided, and an N-type semiconductor layer is formed on the substrate, wherein the N-type semiconductor layer is in a mesa structure having a first area and a second area, and the first area has a higher level than that of the second area. A light-emitting layer is formed on the first area of the N-type semiconductor layer. A P-type semiconductor layer is formed on the light-emitting layer. A low-contact-resistance material layer is formed on part of the P-type semiconductor layer. A transparent conductive layer is formed on the low-contact-resistance material layer and the P-type semiconductor layer. An N-type metal electrode is formed on the second area of the N-type semiconductor layer, and a P-type metal electrode is formed on the transparent conductive layer. The LED is in a mesa structure, and the P-type metal electrode and the N-type metal electrode of the LED are on the same side of the substrate.

According to one embodiment of the present disclosure, the low-contact-resistance material layer surrounds the P-type metal electrode, or is positioned between vertical projection areas of the P-type metal electrode and the N-type metal electrode.

According to one embodiment of the present disclosure, the low-contact-resistance material layer is in a round-hole pattern, a stripe pattern, a lattice pattern, or a combination thereof.

According to one embodiment of the present disclosure, the material of the low-contact-resistance material layer is graphene or a metal selected from the group comprising of nickel (Ni), gold (Au), chromium (Cr), platinum (Pt), rhodium (Rh), titanium (Ti), aluminum (Al), silver (Ag), copper (Cu) and the combinations thereof.

According to one embodiment of the present disclosure, the thickness of the low-contact-resistance material layer is in a range of 0.1 nm to 1000 nm.

According to one embodiment of the present disclosure, the method further comprises forming a metal-indium contact layer positioned between the P-type semiconductor layer and the low-contact-resistance material layer, and the transparent conductive layer covers the low-contact-resistance material layer and the metal-indium contact layer.

According to one embodiment of the present disclosure, the metal-indium contact layer is an indium tin oxide (ITO) layer.

Another aspect of the present disclosure is to provide a method for manufacturing the LED. The method for manufacturing the LED comprises the following steps. An N-type semiconductor layer is provided, which has a first surface and a second surface opposite to the first surface. A light-emitting layer is formed on the first surface of the N-type semiconductor layer. A P-type semiconductor layer is formed on the light-emitting layer. A low-contact-resistance material layer is formed on and surrounds the P-type semiconductor layer. A transparent conductive layer is formed on the low-contact-resistance material layer and the P-type semiconductor layer. A P-type metal electrode is formed on the transparent conductive layer, and an N-type metal electrode is formed on the second surface of the N-type semiconductor layer. The LED is in a vertical structure, and the P-type metal electrode and the N-type metal electrode of the LED are on the opposite sides of the N-type semiconductor layer.

According to one embodiment of the present disclosure, the low-contact-resistance material layer completely or partially surrounds the P-type metal electrode.

According to one embodiment of the present disclosure, the low-contact-resistance material layer is in a round-hole pattern, a stripe pattern, a lattice pattern, or a combination thereof.

According to one embodiment of the present disclosure, the material of the low-contact-resistance material layer is graphene or a metal selected from the group comprising of nickel (Ni), gold (Au), chromium (Cr), platinum (Pt), rhodium (Rh), titanium (Ti), aluminum (Al), silver (Ag), copper (Cu) and the combinations thereof.

According to one embodiment of the present disclosure, the thickness of the low-contact-resistance material layer is in a range of 0.1 nm to 1000 nm.

BRIEF DESCRIPTION OF THE DRAWINGS

For a more complete understanding of the present invention, and the advantages thereof, reference is now made to the following descriptions taken in conjunction with the accompanying drawings, in which:

FIG. 7 is a plurality of patterns of low-contact-resistance material layers in LEDs according to embodiments of the present disclosure;

DETAILED DESCRIPTION

Figure 1:
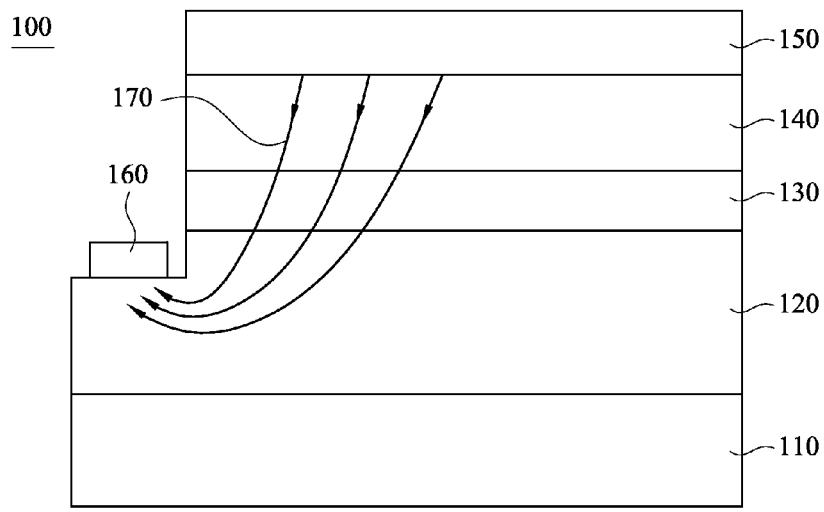
FIG. 1 is a cross-sectional view of a conventional LED, in which the arrows represent current pathway.

The LED and the method for manufacturing the same of the embodiments are discussed in detail below, but not limited the scope of the present disclosure. The same symbols or numbers are used to the same or similar portion in the drawings or the description. And the applications of the present disclosure are not limited by the following embodiments and examples, which the person in the art can apply in the related field.

The singular forms "a," "an" and "the" used herein include plural referents unless the context clearly dictates otherwise. Therefore, reference to, for example, a low-contact-resistance material layer includes embodiments having two or more such low-contact-resistance material layers, unless the context clearly indicates otherwise. Reference throughout this specification to "one embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, the figures are intended; rather, these figures are intended for illustration.

Figure 2:
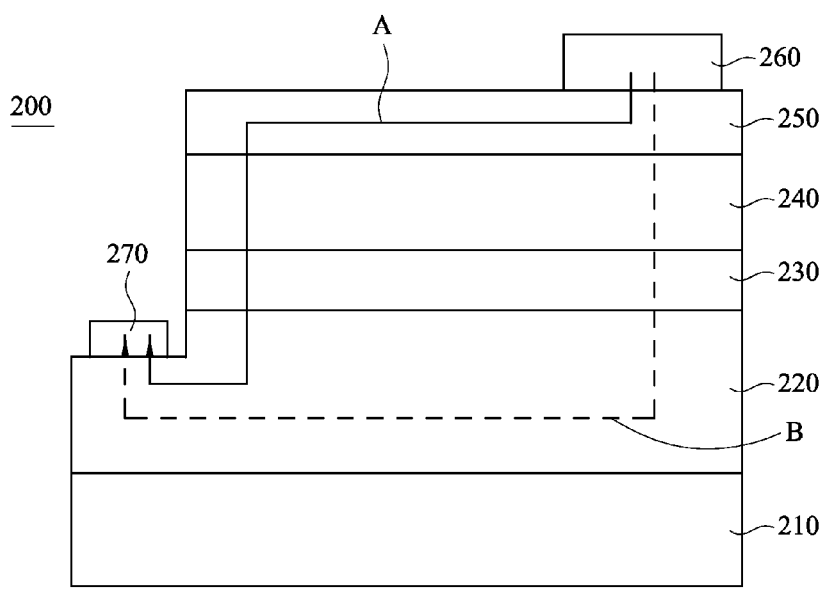
FIG. 2 is a cross-sectional view of a conventional LED, in which the arrows represent current pathway.

In the aforementioned FIG. 2, according to the difference of the resistance between the transparent conductive layer 250 and the N-type semiconductor layer 220, the current path form the P-type metal electrode 260 to the N-type current electrode 270 may be roughly classed as path A and path B.

If the resistance of the transparent conductive layer 250 is much less than the resistance of the N-type semiconductor layer 220, the current is followed path A from the P-type metal electrode 260 to the N-type metal electrode 270, and generate current crowding near the N-type metal electrode 270. Conversely, if the resistance of the N-type semiconductor layer 220 is much less than the resistance of the transparent conductive layer 250, the current is followed path B from the P-type metal electrode 260 to the N-type metal electrode 270, and generate current crowding near the P-type metal electrode 260.

Figure 3A:
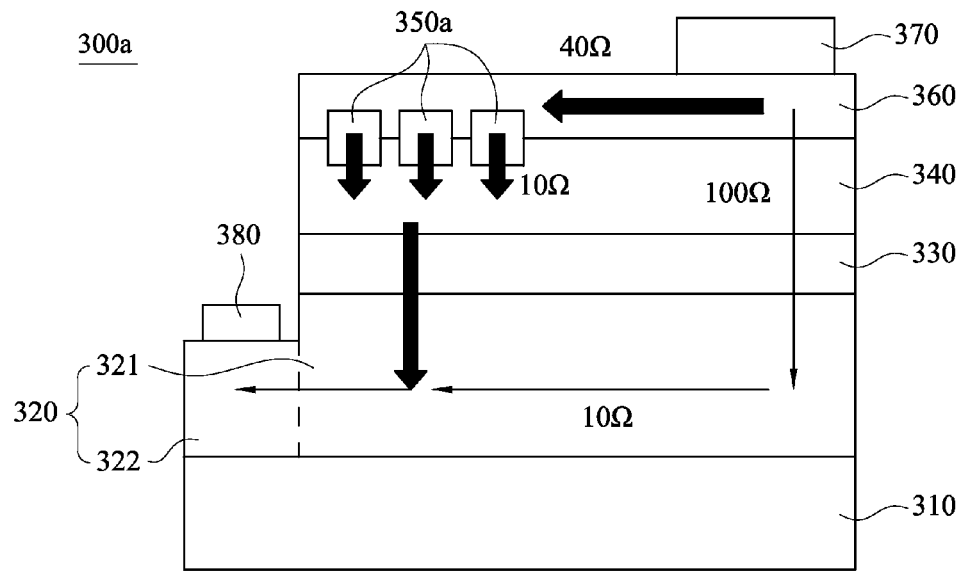
FIG. 3A is a cross-sectional view of an LED according to one embodiment of the present disclosure, in which the arrows represent current pathway.

FIG. 3A is a cross-sectional view of an LED 300a according to one embodiment of the present disclosure, in which the arrows represent current pathway. The LED 300a comprises a substrate 310, an N-type semiconductor layer 320, a light-emitting layer 330, a P-type semiconductor layer 340, a low-contact-resistance material layer 350a, a transparent conductive layer 360, a P-type metal electrode 370 and an N-type metal electrode 380.

In FIG. 3A, the N-type semiconductor layer 320 is positioned on the substrate 310. The N-type semiconductor layer 320 has a first area 321 and a second area 322, and the second area 322 is a mesa structure, wherein the first area 321 is higher than the second area 322. The light-emitting layer 330 and the P-type semiconductor layer 340 are sequentially formed on the first area 321, and the N-type metal electrode 380 is positioned on the second area 322. The low-contact-resistance material layer 350a is positioned on part of the surface of the P-type semiconductor layer 340, and is close to the N-type metal electrode 380. The transparent conductive layer 360 covers the low-contact-resistance material layer 350a and the P-type semiconductor layer 340. The P-type metal electrode 370 is positioned on the transparent conductive layer 360.

If the resistance of the N-type semiconductor layer 320 is much less than the resistance of the transparent conductive layer 360, the current is followed path B in FIG. 2 from the P-type metal electrode 370 to the N-type metal electrode 380, and generate current crowding near the P-type metal electrode 370. As shown in FIG. 3A, the low-contact-resistance material layer 350a is positioned near the N-type metal electrode 380, which may reduce the difference of the resistance between the N-type semiconductor layer 320 and the transparent conductive layer 360, so that current is uniformly distributed in the projection region between the P-type metal electrode 370 and the N-type metal electrode 380.

Figure 4A:
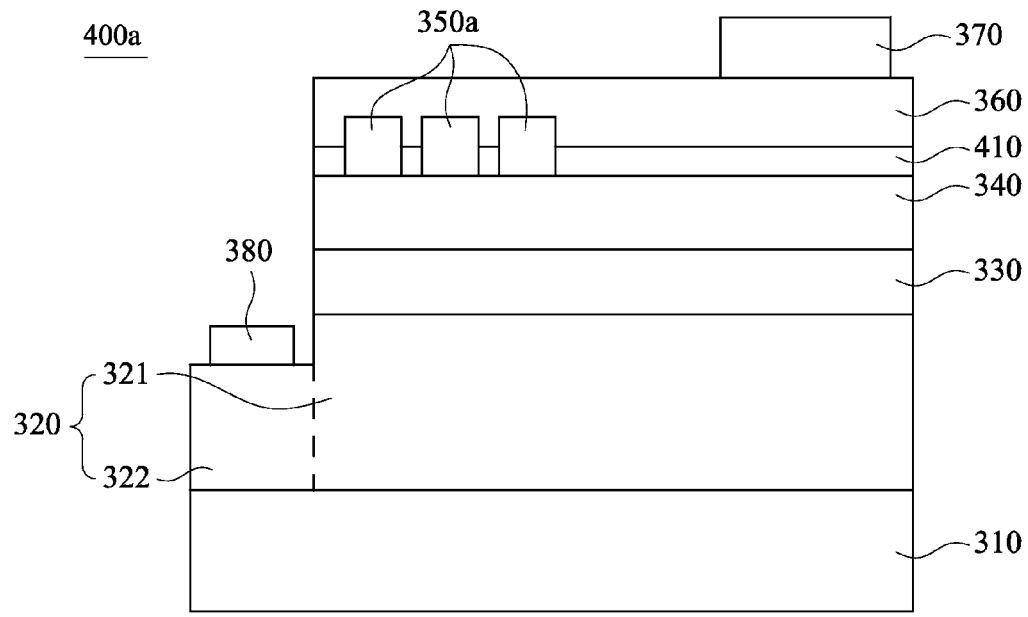
FIG. 4A is a cross-sectional view of an LED according to one embodiment of the present disclosure.

According to one embodiment of the present disclosure, an LED 400a further comprises a metal-indium-contact layer 410, as shown in FIG. 4A. The metal-indium-contact layer 410 is positioned on the P-type semiconductor layer 340, and then the transparent conductive layer 360 covers the low-contact-resistance material layer 350a and the metal-indium-contact layer 410. In FIG. 4A, the low-contact-resistance material layer 350a contacts to the P-type semiconductor layer 340. According to one embodiment of the present disclosure, the metal-indium-contact layer 410 is an indium-tin-oxide layer.

Figure 4B:
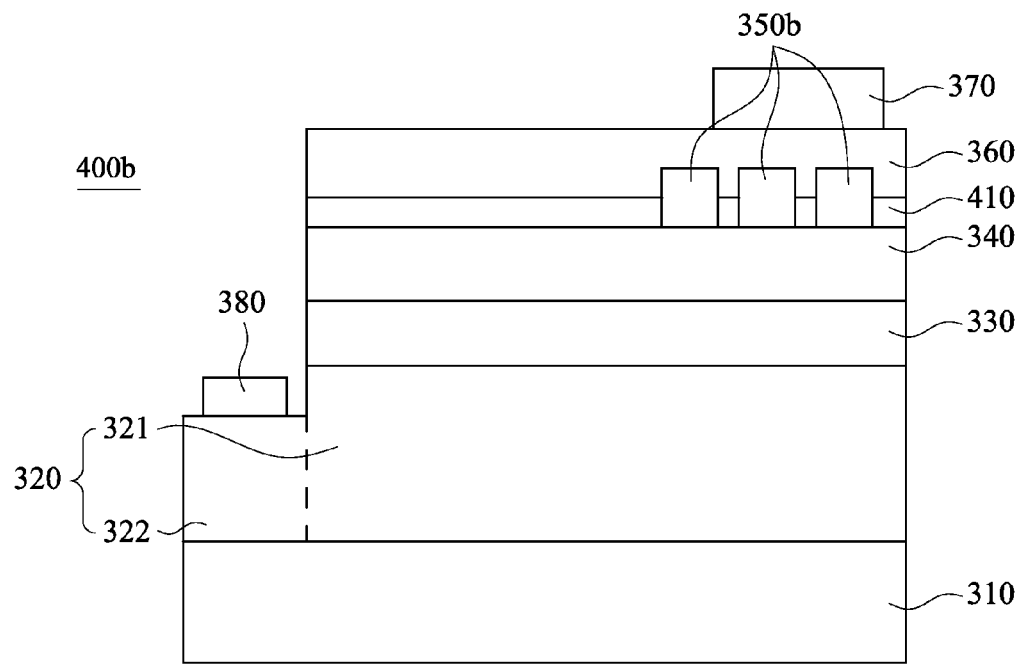
FIG. 4B is a cross-sectional view of an LED according to one embodiment of the present disclosure.
Figure 4C:
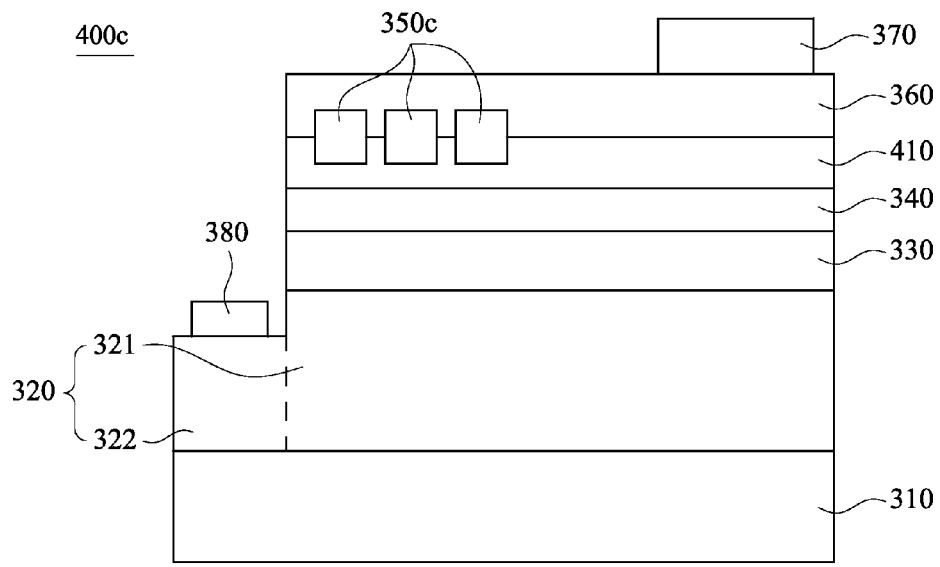
FIG. 4C is a cross-sectional view of an LED according to one embodiment of the present disclosure.

According to one embodiment of the present disclosure, an LED 400c further comprises a metal-indium-contact layer 410, as shown in FIG. 4C. The metal-indium-contact layer 410 is sandwiched between the P-type semiconductor layer 340 and the low-contact-resistance metal layer 350c, and then the transparent conductive layer 360 covers the low-contact-resistance material layer 350a and the metal-indium-contact layer 410. According to one embodiment of the present disclosure, the metal-indium-contact layer 410 is an indium-tin-oxide layer.

Figure 3B:
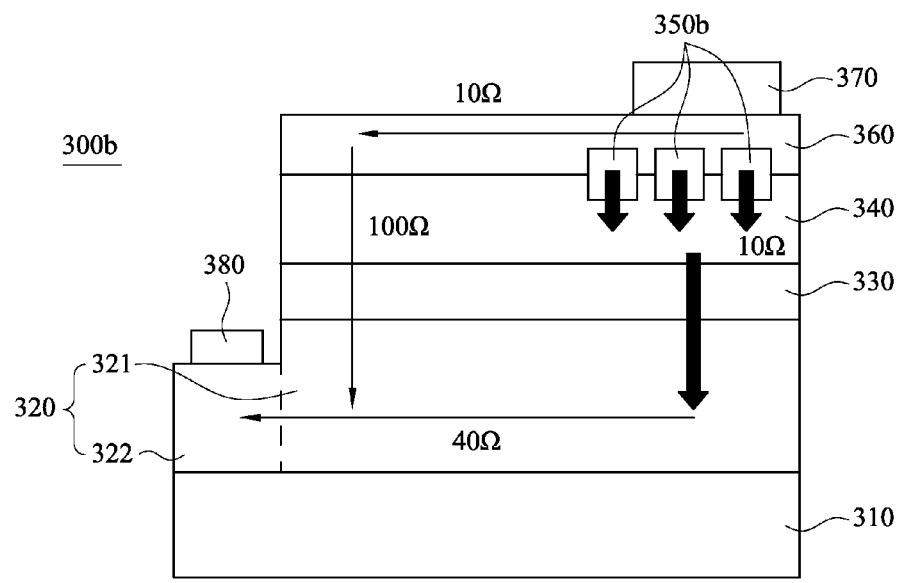
FIG. 3B is a cross-sectional view of an LED according to one embodiment of the present disclosure, in which the arrows represent current pathway.

FIG. 3B is a cross-sectional view of an LED 300b according to one embodiment of the present disclosure, in which the arrows represent current pathway. The LED 300b comprises a substrate 310, an N-type semiconductor layer 320, a light-emitting layer 330, a P-type semiconductor layer 340, a low-contact-resistance material layer 350b, a transparent conductive layer 360, a P-type metal electrode 370 and an N-type metal electrode 380.

In FIG. 3B, the N-type semiconductor layer 320 is positioned on the substrate 310. The N-type semiconductor layer 320 has a first area 321 and a second area 322, and the second area 322 is a mesa structure, wherein the first area 321 is higher than the second area 322. The light-emitting layer 330 and the P-type semiconductor layer 340 is sequentially formed on the first area 321, and the N-type metal electrode 380 is positioned on the second area 322. The low-contact-resistance material layer 350b is positioned on part of the surface of the P-type semiconductor layer 340, and is close to the P-type metal electrode 370. The transparent conductive layer 360 covers the low-contact-resistance material layer 350b and the P-type semiconductor layer 340. The P-type metal electrode 370 is positioned on the transparent conductive layer 360.

If the resistance of the transparent conductive layer 360 is much less than the resistance of the N-type semiconductor layer 320, the current is followed path A in FIG. 2 from the P-type metal electrode 370 to the N-type metal electrode 380, and generate current crowding near the N-type metal electrode 380. As shown in FIG. 3B, the low-contact-resistance material layer 350b is positioned near the P-type metal electrode 370, which may reduce the difference of the resistance between the N-type semiconductor layer 320 and the transparent conductive layer 360, so that current is uniformly distributed in the projection region between the P-type metal electrode 370 and the N-type metal electrode 380.

According to one embodiment of the present disclosure, an LED 400b further comprises a metal-indium-contact layer 410, as shown in FIG. 4B. The metal-indium-contact layer 410 is positioned on the P-type semiconductor layer 340, and then the transparent conductive layer 360 covers the low-contact-resistance material layer 350b and the metal-indium-contact layer 410. In FIG. 4B, the low-contact-resistance material layer 350b contacts to the P-type semiconductor layer 340. According to one embodiment of the present disclosure, the metal-indium-contact layer 410 is an indium-tin-oxide layer.

Figure 4D:
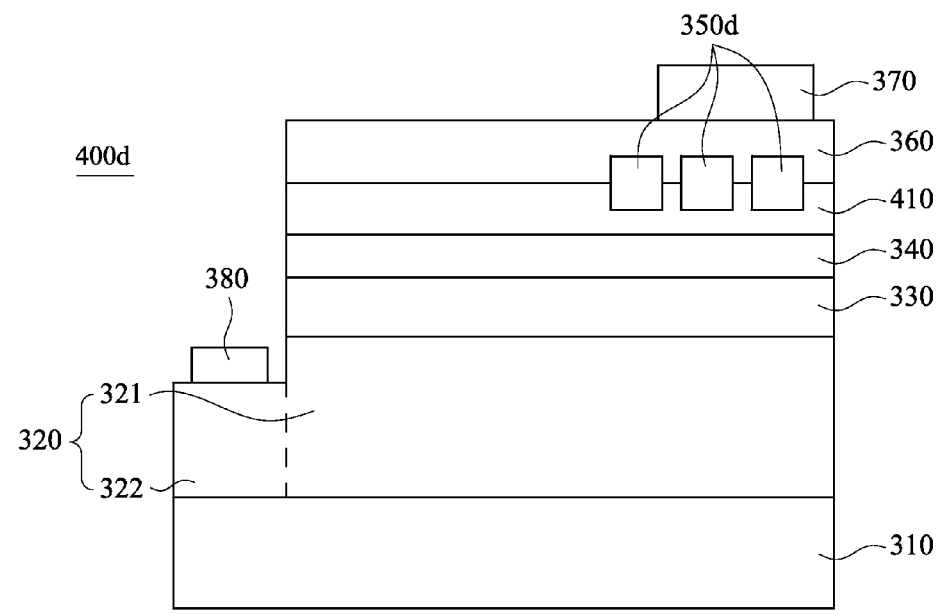
FIG. 4D is a cross-sectional view of an LED according to one embodiment of the present disclosure.

According to one embodiment of the present disclosure, an LED 400d further comprises a metal-indium-contact layer 410, as shown in FIG. 4D. The metal-indium-contact layer 410 is sandwiched between the P-type semiconductor layer 340 and the low-contact-resistance metal layer 350d, and then the transparent conductive layer 360 covers the low-contact-resistance material layer 350d and the metal-indium-contact layer 410. According to one embodiment of the present disclosure, the metal-indium-contact layer 410 is an indium-tin-oxide layer.

Figure 5A:
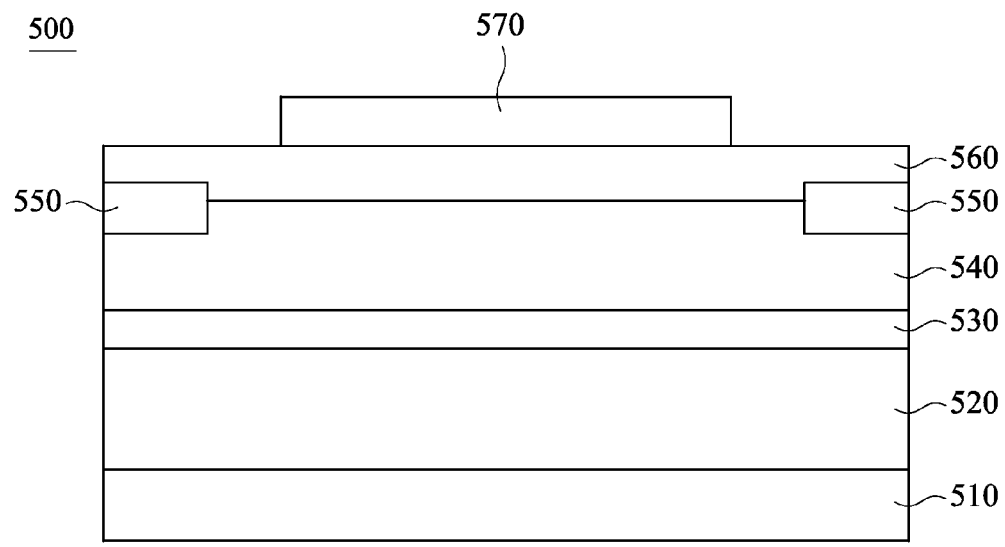
FIG. 5A is a cross-sectional view of an LED according to one embodiment of the present disclosure.

FIG. 5A is a cross-sectional view of an LED 500 according to one embodiment of the present disclosure. The LED 500 comprises an N-type metal electrode 510, an N-type semiconductor layer 520, a light-emitting diode 530, a P-type semiconductor layer 540, a low-contact-resistance material layer 550, a transparent conductive layer 560 and a P-type metal electrode 570.

In FIG. 5A, the N-type semiconductor layer 520 contacts to the N-type metal electrode 510. The light-emitting layer 530 is sandwiched between the N-type semiconductor layer 520 and the P-type semiconductor layer 540. The low-contact-resistance material layer 550 covers the low-contact-resistance material layer 550 and the P-type semiconductor layer 540. In which, the N-type metal electrode 510 and the P-type metal electrode 570 are individually positioned on the opposite sides of the light-emitting layer 530.

Figure 5B:
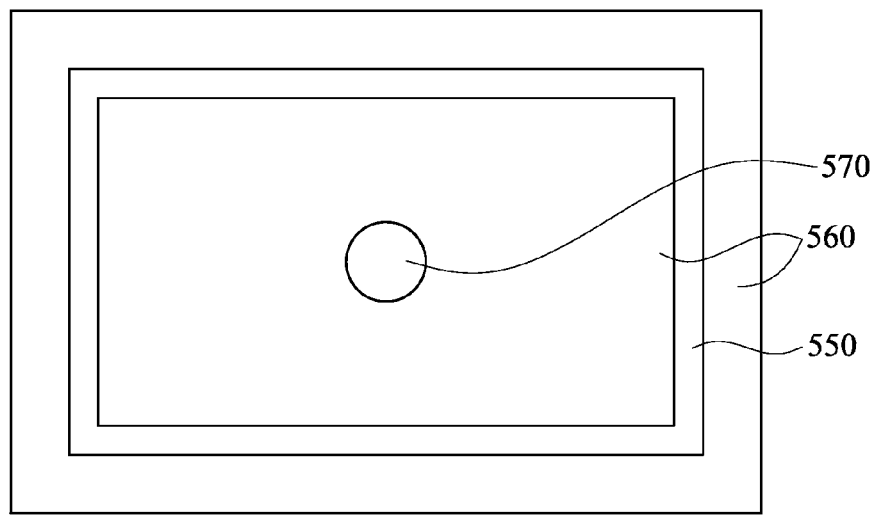
FIG. 5B is a top view of an LED according to one embodiment of the present disclosure.

FIG. 5B is a top view of an LED 500 according to one embodiment of the present disclosure. In FIG. 5B, the P-type metal electrode 570 is positioned on the center of the transparent conductive layer 560, and then the low-contact-resistance material layer 550 completely around the P-type metal electrode 570. According to one embodiment of the present disclosure, the low-contact-resistance material layer is partially around the P-type metal electrode.

Figure 6A:
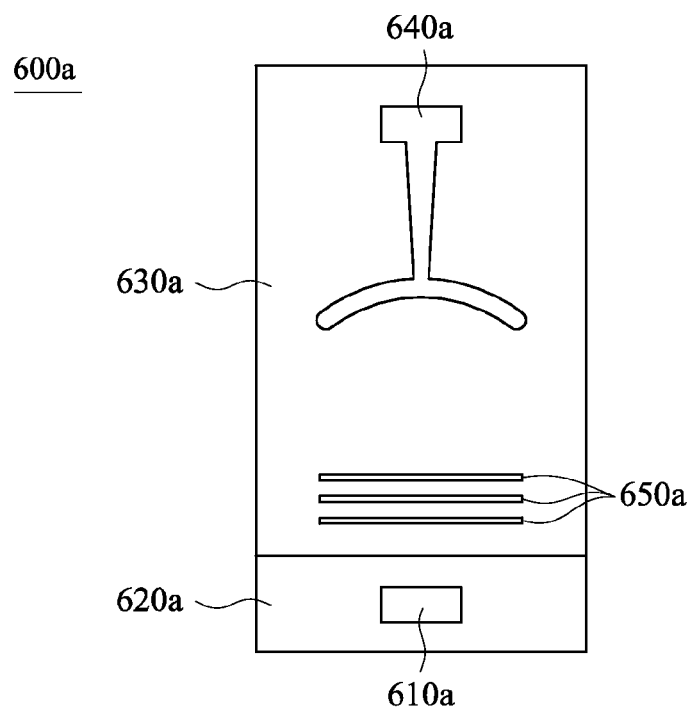
FIGS. 6A-6K and 6M-6P are top views of LEDs according to embodiments of the present disclosure.

FIG. 6A is a top view of an LED 600a according to embodiments of the present disclosure. In FIG. 6A, the LED 600a comprises an N-type metal electrode 610a, an N-type semiconductor layer 620a, a transparent conductive layer 630a, a P-type metal electrode 640a and a low-contact-resistance material layer 650a. In which, the low-contact-resistance material layer 650a is in a stripe pattern, which is parallel arranged on the transparent conductive layer 630a, and is close to the N-type metal electrode 610a.

Figure 6B:
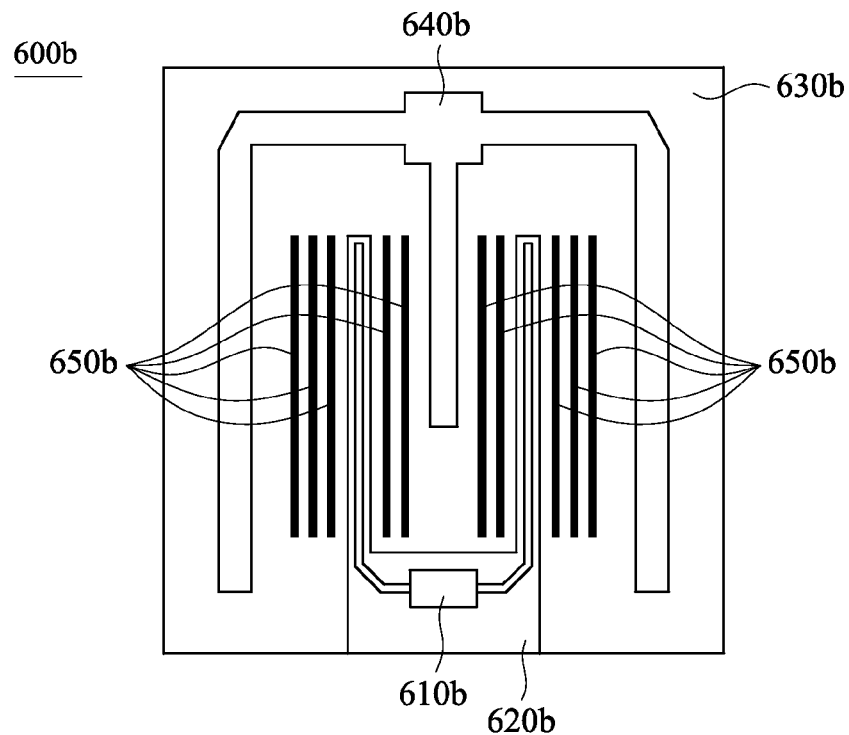

FIG. 6B is a top view of an LED 600b according to embodiments of the present disclosure. In FIG. 6B, the LED 600b comprises an N-type metal electrode 610b, an N-type semiconductor layer 620b, a transparent conductive layer 630b, a P-type metal electrode 640b and a low-contact-resistance material layer 650b. In which, the low-contact-resistance material layer 650b is in a stripe pattern, which is parallel arranged on the transparent conductive layer 630b, and is close to the N-type metal electrode 610b.

Figure 6C:
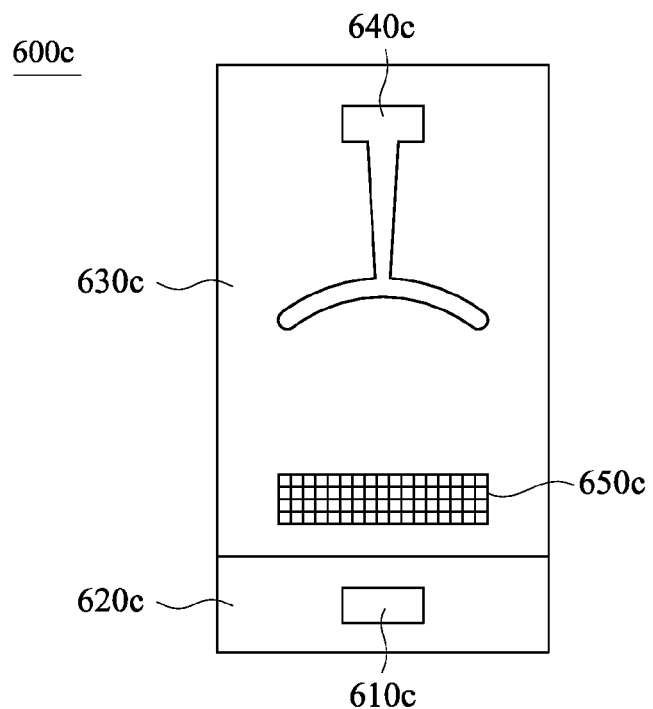

FIG. 6C is a top view of an LED 600c according to embodiments of the present disclosure. In FIG. 6C, the LED 600c comprises an N-type metal electrode 610c, an N-type semiconductor layer 620c, a transparent conductive layer 630c, a P-type metal electrode 640c and a low-contact-resistance material layer 650c. In which, the low-contact-resistance material layer 650c is in a lattice pattern, which is parallel arranged on the transparent conductive layer 630c, and is close to the N-type metal electrode 610c.

Figure 6D:
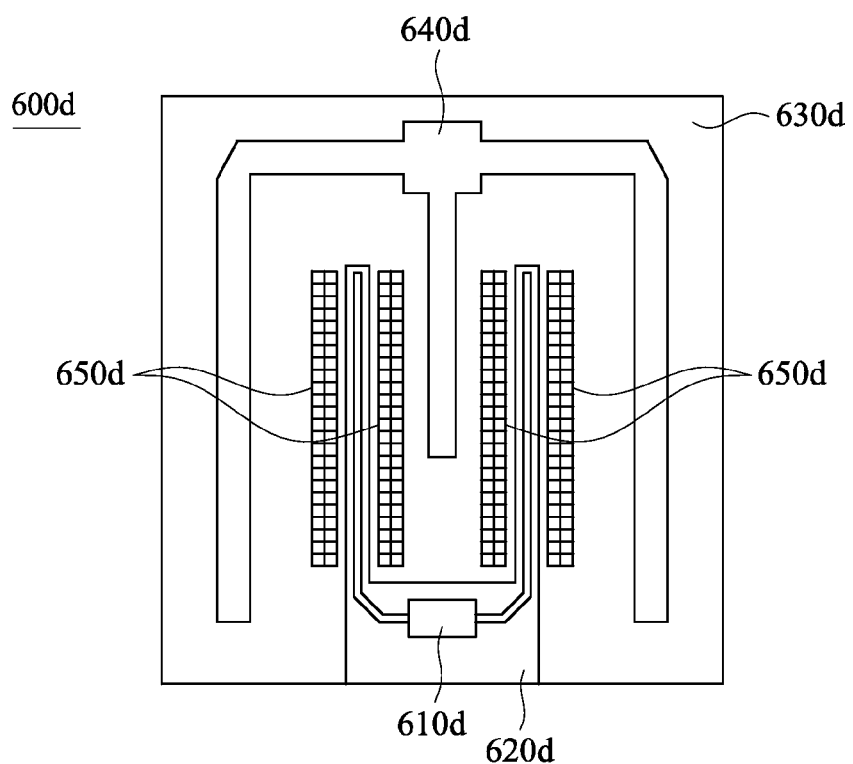

FIG. 6D is a top view of an LED 600d according to embodiments of the present disclosure. In FIG. 6D, the LED 600d comprises an N-type metal electrode 610d, an N-type semiconductor layer 620d, a transparent conductive layer 630d, a P-type metal electrode 640d and a low-contact-resistance material layer 650d. In which, the low-contact-resistance material layer 650d is in a lattice pattern, which is parallel arranged on the transparent conductive layer 630d, and is close to the N-type metal electrode 610d.

Figure 6E:
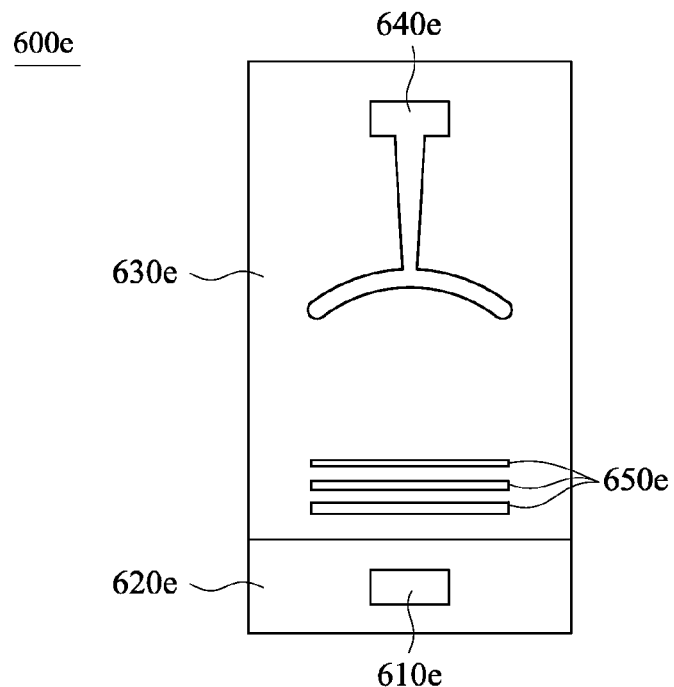

FIG. 6E is a top view of an LED 600e according to embodiments of the present disclosure. In FIG. 6E, the LED 600e comprises an N-type metal electrode 610e, an N-type semiconductor layer 620e, a transparent conductive layer 630e, a P-type metal electrode 640e and a low-contact-resistance material layer 650e. In which, the low-contact-resistance material layer 650e is in a stripe pattern, which is parallel arranged on the transparent conductive layer 630e, and is close to the N-type metal electrode 610e. It is worthwhile to note that, the more close to the N-type metal electrode 610e, the wider is the width of the low-contact-resistance material layer 650e.

Figure 6F:
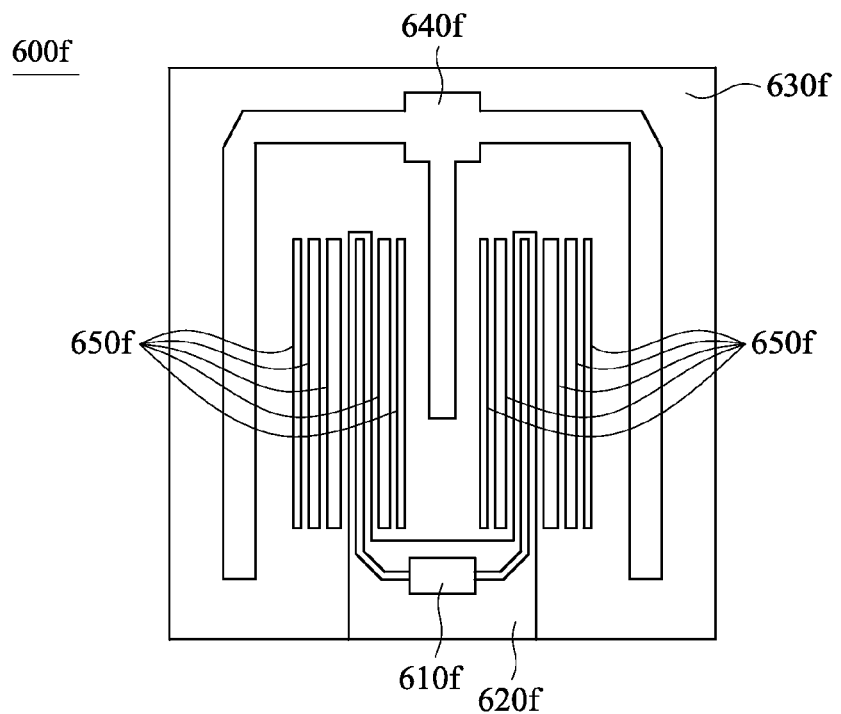

FIG. 6F is a top view of an LED 600f according to embodiments of the present disclosure. In FIG. 6F, the LED 600f comprises an N-type metal electrode 610f, an N-type semiconductor layer 620f, a transparent conductive layer 630f, a P-type metal electrode 640f and a low-contact-resistance material layer 650f. In which, the low-contact-resistance material layer 650f is in a stripe pattern, which is parallel arranged on the transparent conductive layer 630f, and is close to the N-type metal electrode 610f. It is worthwhile to note that, the more close to the N-type metal electrode 610f, the wider is the width of the low-contact-resistance material layer 650f.

Figure 6G:
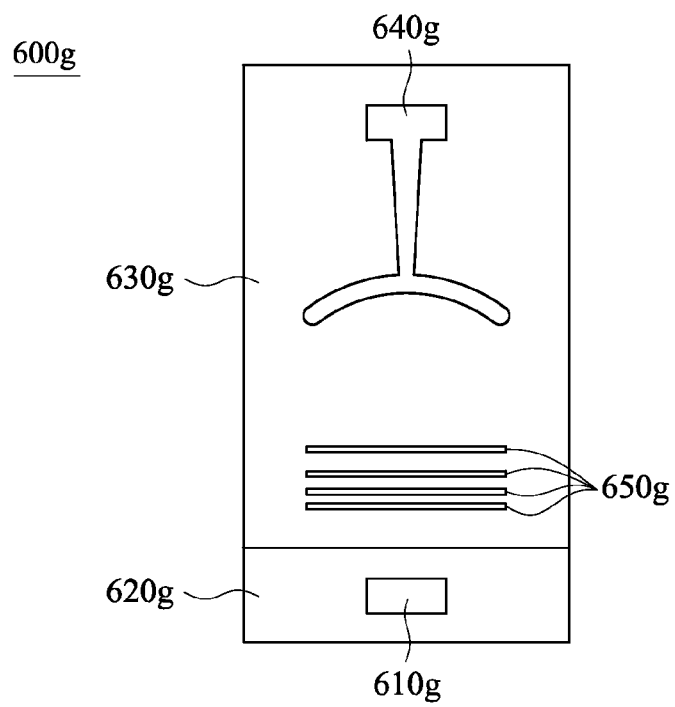

FIG. 6G is a top view of an LED 600g according to embodiments of the present disclosure. In FIG. 6G, the LED 600g comprises an N-type metal electrode 610g, an N-type semiconductor layer 620g, a transparent conductive layer 630g, a P-type metal electrode 640g and a low-contact-resistance material layer 650g. In which, the low-contact-resistance material layer 650g is in a stripe pattern, which is parallel arranged on the transparent conductive layer 630g, and is close to the N-type metal electrode 610g. It is worthwhile to note that, the more close to the N-type metal electrode 610g, the shorter is the distance of the low-contact-resistance material layer 650g.

Figure 6H:
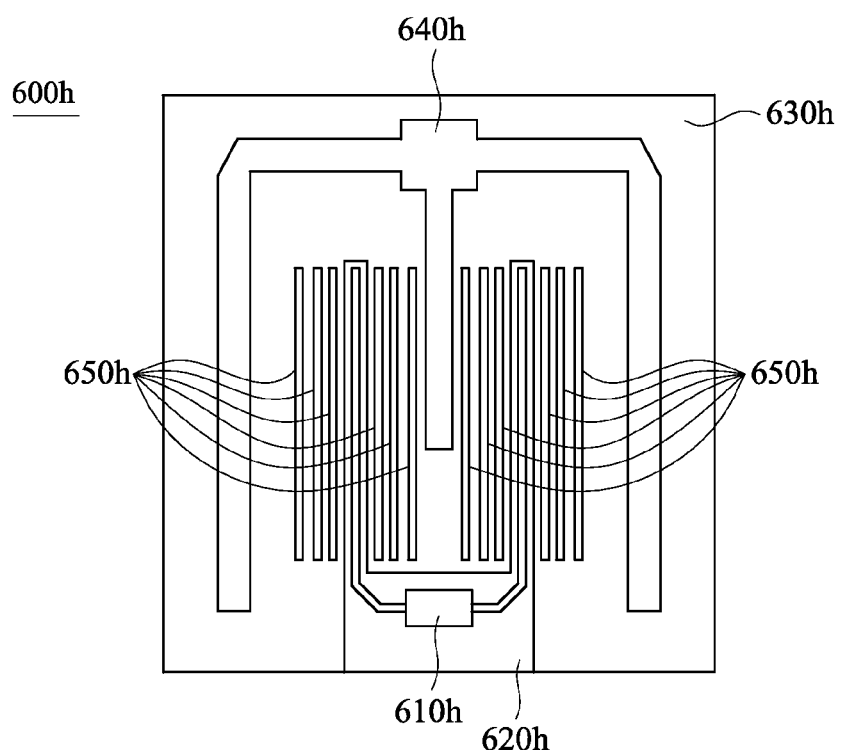

FIG. 6H is a top view of an LED 600h according to embodiments of the present disclosure. In FIG. 6H, the LED 600h comprises an N-type metal electrode 610h, an N-type semiconductor layer 620h, a transparent conductive layer 630h, a P-type metal electrode 640h and a low-contact-resistance material layer 650h. In which, the low-contact-resistance material layer 650h is in a stripe pattern, which is parallel arranged on the transparent conductive layer 630h, and is close to the N-type metal electrode 610h. It is worthwhile to note that, the more close to the N-type metal electrode 610h, the shorter is the distance of the low-contact-resistance material layer 650h.

Figure 6I:
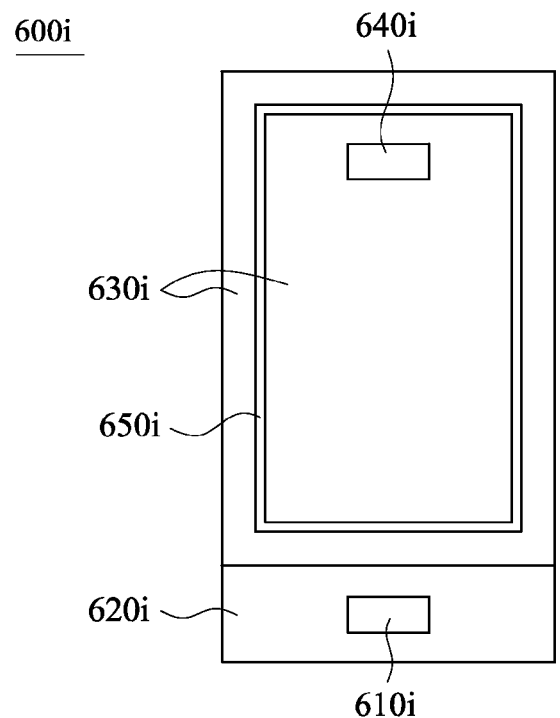

FIG. 6I is a top view of an LED 600i according to embodiments of the present disclosure. In FIG. 6I, the LED 600i comprises an N-type metal electrode 610i, an N-type semiconductor layer 620i, a transparent conductive layer 630i, a P-type metal electrode 640i and a low-contact-resistance material layer 650i. In which, the low-contact-resistance material layer 650i is in a square shape, and completely surrounds the P-type metal electrode 640i.

Figure 6J:
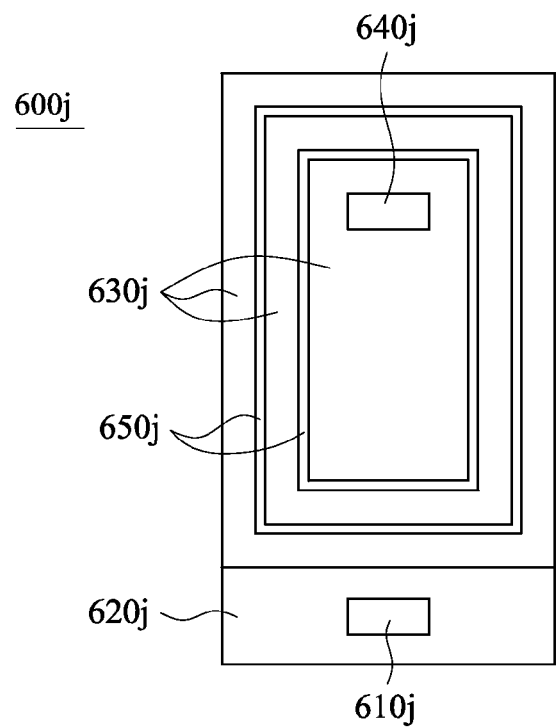

FIG. 6J is a top view of an LED 600j according to embodiments of the present disclosure. In FIG. 6J, the LED 600j comprises an N-type metal electrode 610j, an N-type semiconductor layer 620j, a transparent conductive layer 630j, a P-type metal electrode 640j and a low-contact-resistance material layer 650j. In which, the low-contact-resistance material layer 650i is in a multiple frame, and completely surrounds the P-type metal electrode 640j.

Figure 6K:
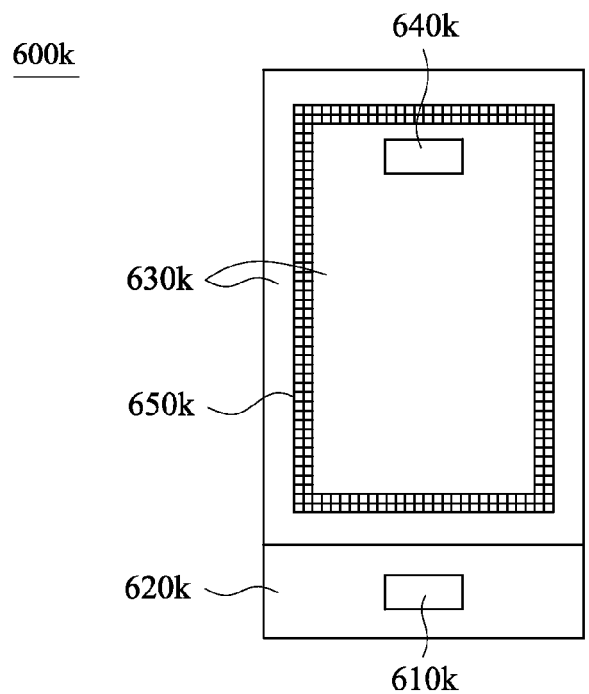

FIG. 6K is a top view of an LED 600k according to embodiments of the present disclosure. In FIG. 6K, the LED 600k comprises an N-type metal electrode 610k, an N-type semiconductor layer 620k, a transparent conductive layer 630k, a P-type metal electrode 640k and a low-contact-resistance material layer 650k. In which, the low-contact-resistance material layer 650k is in a lattice frame, and completely surrounds the P-type metal electrode 640k.

Figure 6M:
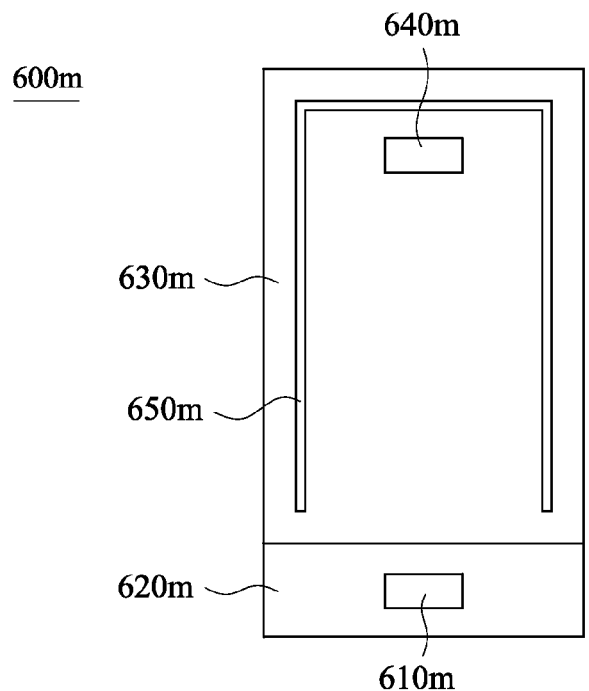

FIG. 6M is a top view of an LED 600m according to embodiments of the present disclosure. In FIG. 6M, the LED 600m comprises an N-type metal electrode 610m, an N-type semiconductor layer 620m, a transparent conductive layer 630m, a P-type metal electrode 640m and a low-contact-resistance material layer 650m. In which, the low-contact-resistance material layer 650m is in a U-shape, and partially surrounds the P-type metal electrode 640m, and the opening of the U-shape is toward the N-type metal electrode 610m.

Figure 6N:
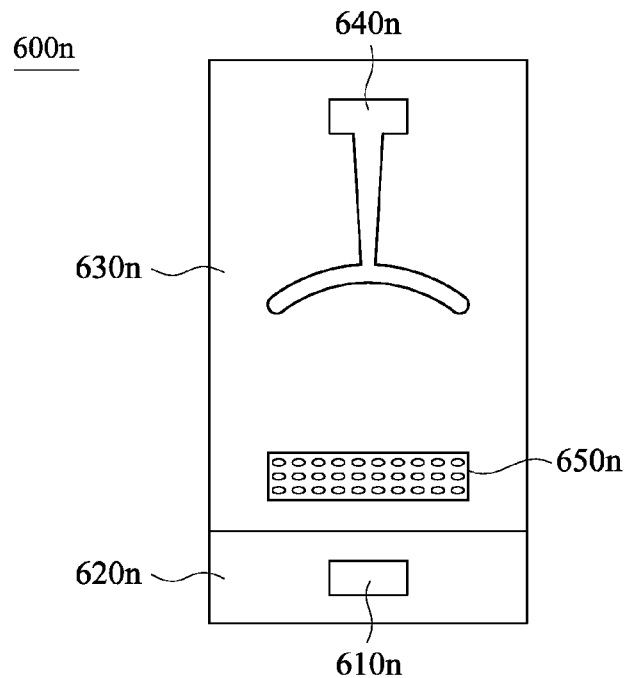

FIG. 6N is a top view of an LED 600n according to embodiments of the present disclosure. In FIG. 6N, the LED 600n comprises an N-type metal electrode 610n, an N-type semiconductor layer 620n, a transparent conductive layer 630n, a P-type metal electrode 640n and a low-contact-resistance material layer 650n. In which, the low-contact-resistance material layer 650n has a plurality of round holes, which is parallel arranged on the transparent conductive layer 630n, and is close to the N-type metal electrode 610n.

Figure 6O:
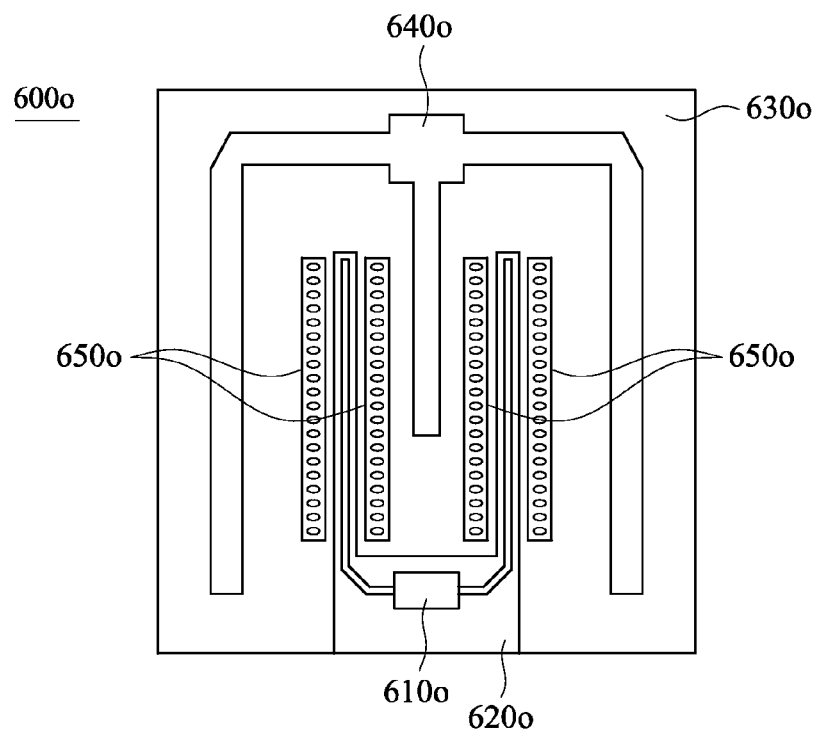

FIG. 6O is a top view of an LED 600o according to embodiments of the present disclosure. In FIG. 6O, the LED 600o comprises an N-type metal electrode 610o, an N-type semiconductor layer 620o, a transparent conductive layer 630o, a P-type metal electrode 640o and a low-contact-resistance material layer 650o. In which, the low-contact-resistance material layer 650o has a plurality of round holes, which is parallel arranged on the transparent conductive layer 630o, and is close to the N-type metal electrode 610o.

Figure 6P:
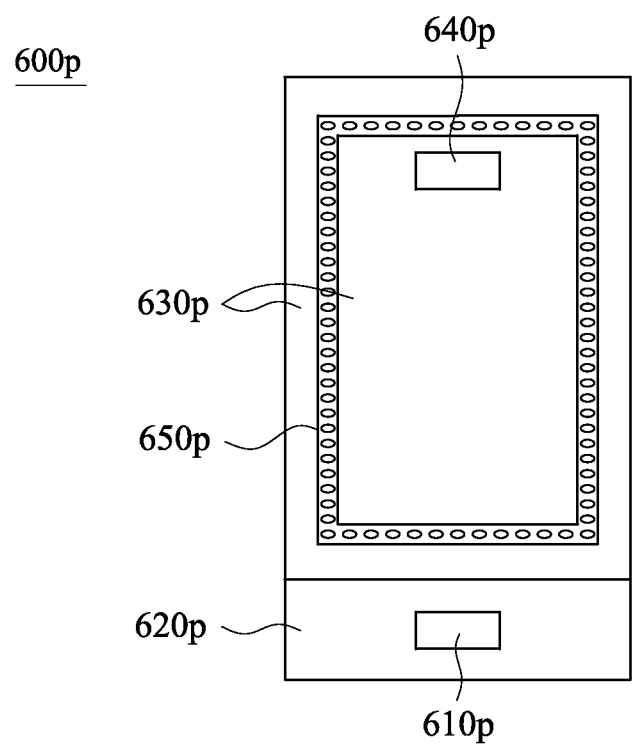

FIG. 6P is a top view of an LED 600p according to embodiments of the present disclosure. In FIG. 6P, the LED 600p comprises an N-type metal electrode 610p, an N-type semiconductor layer 620p, a transparent conductive layer 630p, a P-type metal electrode 640p and a low-contact-resistance material layer 650p. In which, the low-contact-resistance material layer 650p is in a frame with a plurality of round holes, and completely surrounds the P-type metal electrode 640p.

According to one embodiment of the present disclosure, the material of the low-contact-resistance material layer is graphene or a metal selected from the group comprising of nickel (Ni), gold (Au), chromium (Cr), platinum (Pt), rhodium (Rh), titanium (Ti), aluminum (Al), silver (Ag), copper (Cu) and the combinations thereof.

According to one embodiment of the present disclosure, the thickness of the low-contact-resistance material layer is in a range of 0.1 nm to 1000 nm.

According to one embodiment of the present disclosure, the low-contact-resistance material layer comprises a plurality of patterns 700a-700e as shown in FIG. 7.

Figure 8A:
FIGS. 8A-8H are cross-sectional views of manufacturing an LED according to one embodiment of the present disclosure.
Figure 8B:
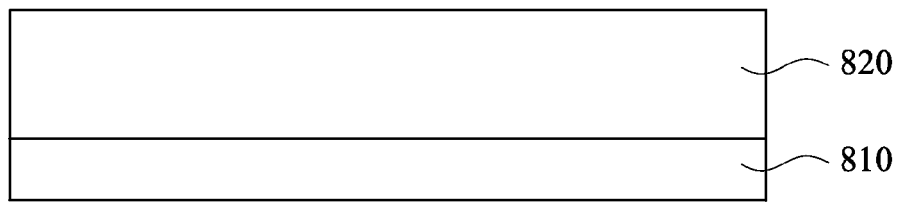
Figure 8C:
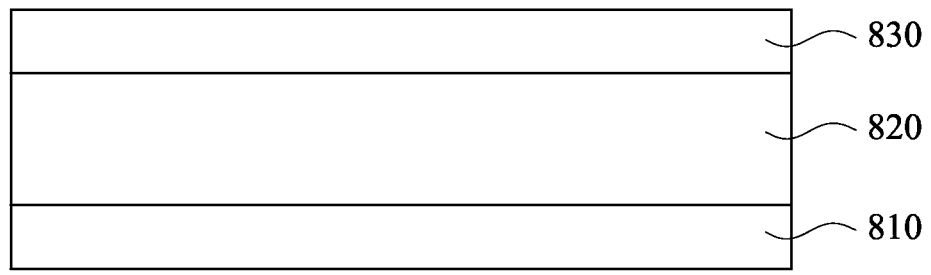
Figure 8D:

FIGS. 8A-8H are cross-sectional views of manufacturing an LED 800 according to one embodiment of the present disclosure. In FIG. 8A, a substrate 810 is provided. And then, an N-type semiconductor layer 820 is formed on the substrate 810, as shown in FIG. 8B, wherein the N-type semiconductor layer 820 has a first area 821 and a second area 822. In FIG. 8C, a light-emitting layer 830 is formed on the N-type semiconductor layer 820. In FIG. 8D, a P-type semiconductor layer 840 is formed on the light-emitting layer 830.

Figure 8E:
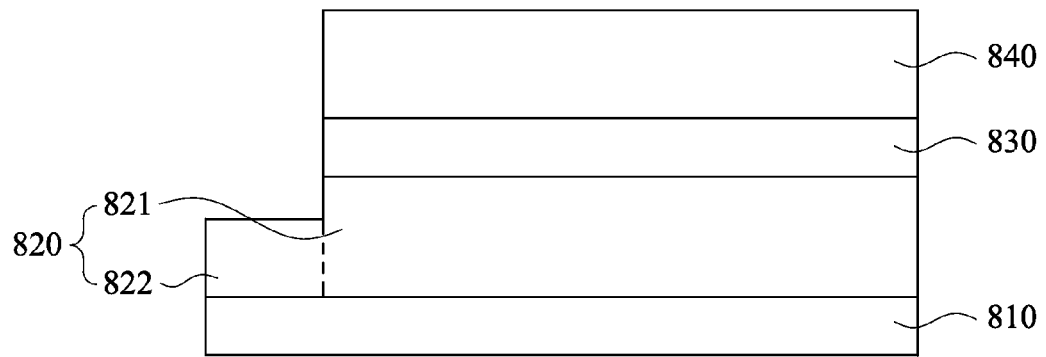
Figure 8F:
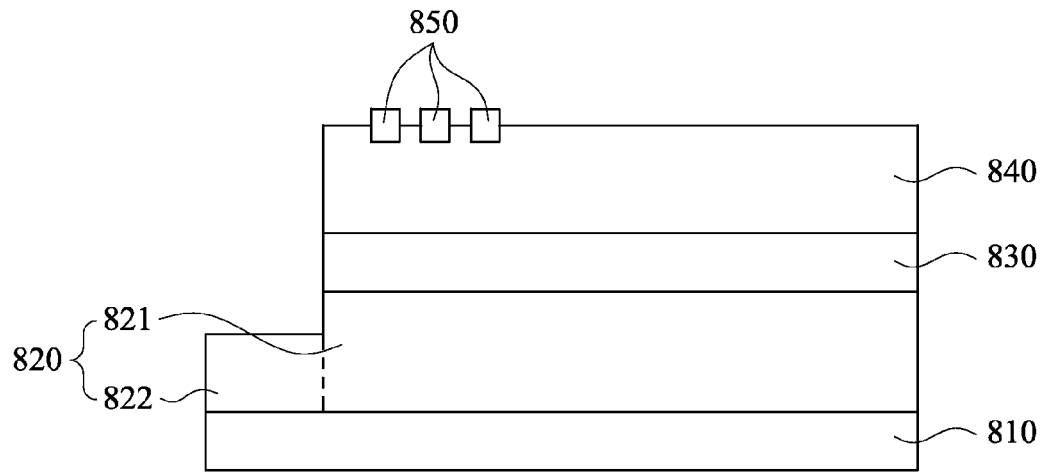
Figure 8G:
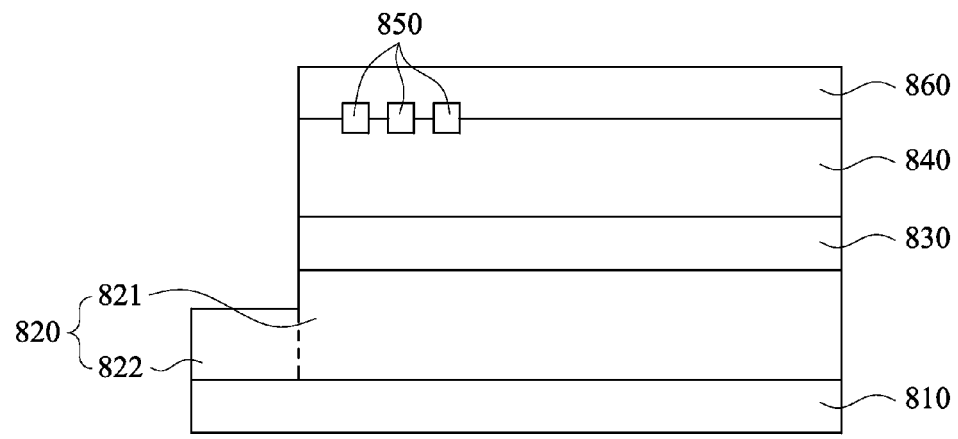
Figure 8H:
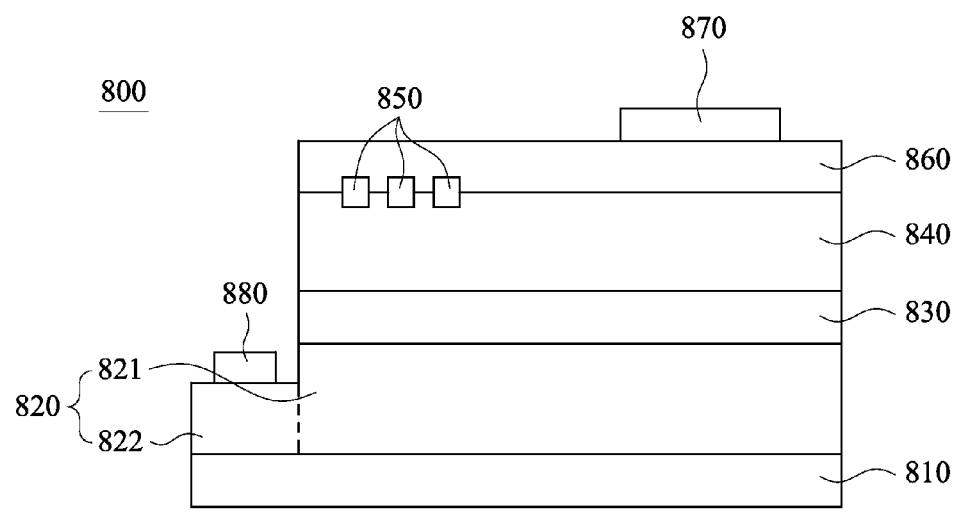

In FIG. 8E, by an etching step, the P-type semiconductor layer 840, the light-emitting layer 830 and part of the N-type semiconductor layer 820 positioned on the second area 822 of the N-type semiconductor layer 820 are removed, so that the first area 821 of the N-type semiconductor layer 820 is higher than the second area 822. And then, a low-contact-resistance material layer 850 is formed on part of the P-type semiconductor layer 840, as shown in FIG. 8F. A transparent conductive layer 860 is formed on the low-contact-resistance material layer 850 and the P-type semiconductor layer 840, as shown in FIG. 8G. In FIG. 8H, a P-type metal electrode 870 is formed on the transparent conductive layer 860, and an N-type metal electrode 880 is formed on the second area 822 of the N-type semiconductor layer 820, so as to form the LED 800. In which, the LED 800 has a mesa structure, and the P-type metal electrode 870 and the N-type metal electrode 880 are positioned at the same side of the substrate 810.

According to one embodiment of the present disclosure, the low contact resistance layer 850 surrounds the P-type metal electrode 870, or is positioned between vertical projection regions of the P-type metal electrode 870 and the N-type metal electrode 880.

According to one embodiment of the present disclosure, the low-contact-resistance material layer 850 is in a round-hole pattern, a stripe pattern, a lattice pattern, or a combination thereof.

According to one embodiment of the present disclosure, the material of the low-contact-resistance material layer 850 is graphene or a metal selected from the group comprising of nickel (Ni), gold (Au), chromium (Cr), platinum (Pt), rhodium (Rh), titanium (Ti), aluminum (Al), silver (Ag), copper (Cu) and the combinations thereof.

According to one embodiment of the present disclosure, the thickness of the low-contact-resistance material layer 850 is in a range of 0.1 nm to 1000 nm.

According to one embodiment of the present disclosure, the LED further comprises a metal-indium-contact layer sandwiched between the P-type semiconductor layer and the low-contact-resistance metal layer, and then the transparent conductive layer covers the low-contact-resistance material layer and the metal-indium-contact layer. According to one embodiment of the present disclosure, the metal-indium-contact layer is an indium-tin-oxide layer.

Figure 9A:
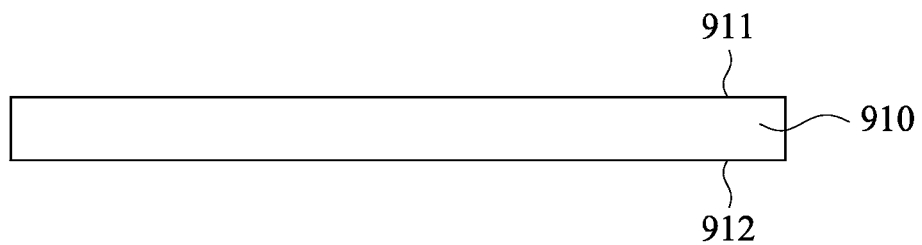
FIGS. 9A-9F are cross-sectional views of manufacturing an LED according to one embodiment of the present disclosure.
Figure 9B:
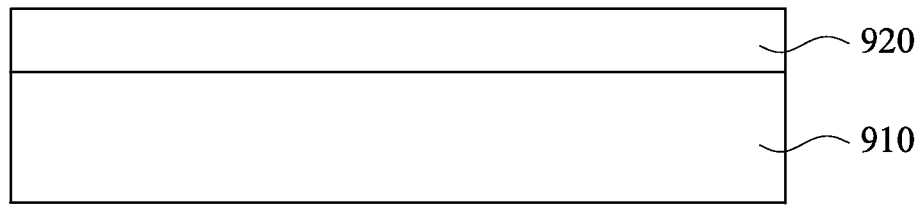
Figure 9C:
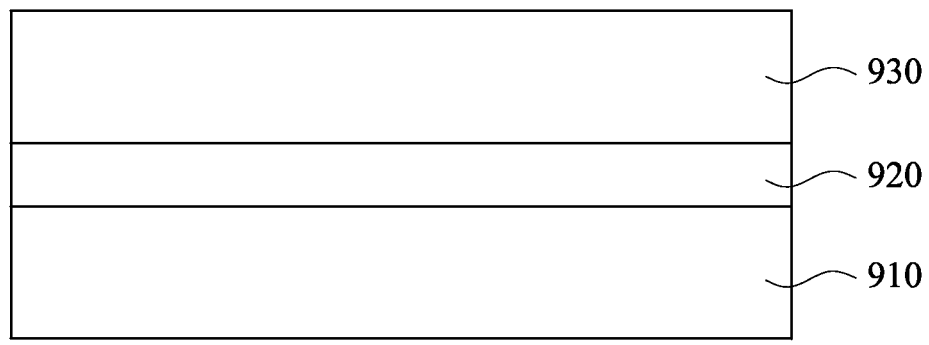

FIGS. 9A-9F are cross-sectional views of manufacturing an LED according to one embodiment of the present disclosure. In FIG. 9A, an N-type semiconductor layer 910 is provided, and has a first surface 911 and a second surface 912 on the opposite side. A light-emitting layer 920 is formed on the first surface 911 of the N-type semiconductor layer 910, as shown in FIG. 9B. And then, in FIG. 9C, a P-type semiconductor layer 930 is formed on the light-emitting layer 920.

Figure 9D:
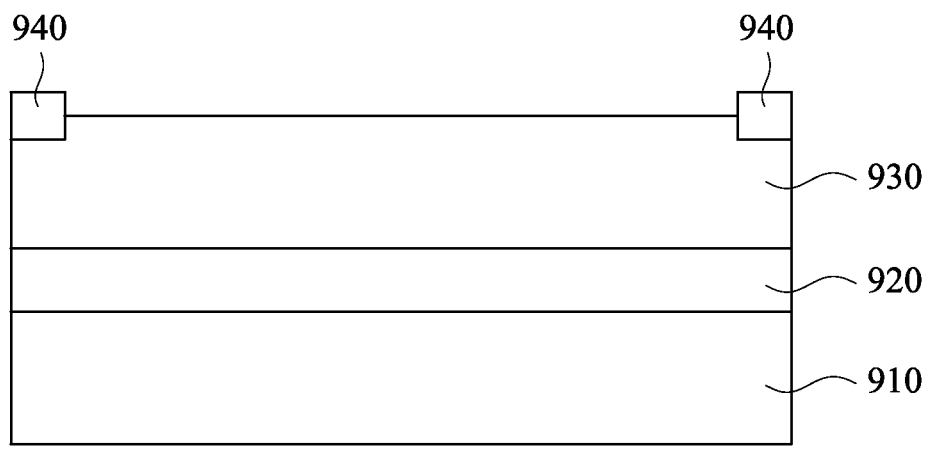
Figure 9E:
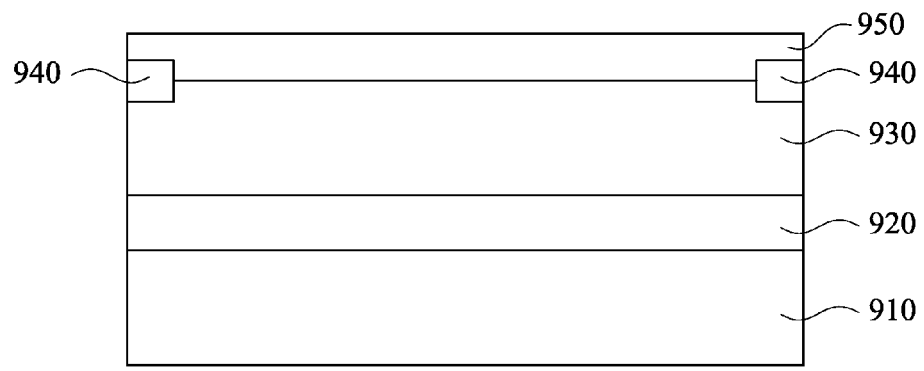
Figure 9F:
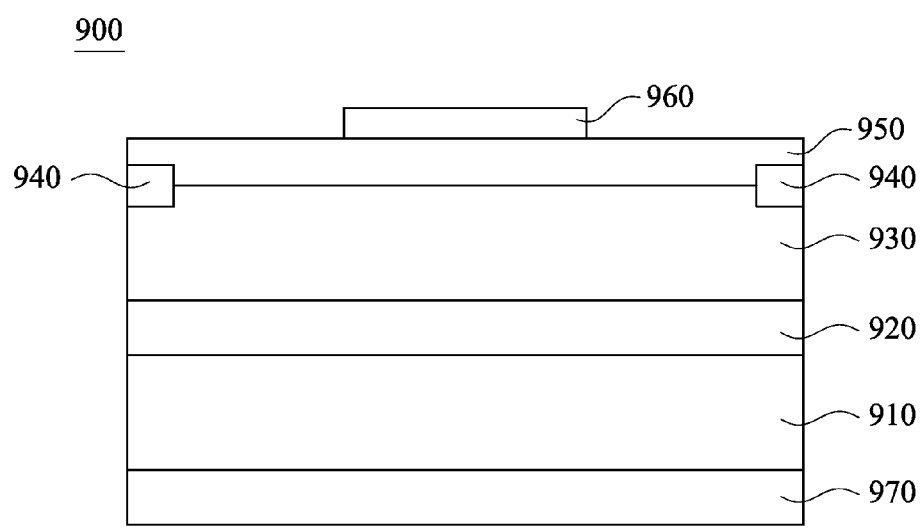

In FIG. 9D, a low-contact-resistance material layer 940 is formed around the P-type semiconductor layer 930. And then, a transparent conductive layer 950 is formed on the low-contact-resistance layer 940 and the P-type semiconductor layer 930, as shown in FIG. 9E. In FIG. 9F, a P-type metal electrode 960 is formed on the transparent conductive layer 950, and an N-type metal electrode 970 is formed on the second surface 912 of the N-type semiconductor layer 910, so as to form the LED 900. In which, the LED 900 has a vertical structure, and the P-type metal electrode 960 and the N-type semiconductor layer 970 are on the opposite sides of the N-type semiconductor layer 910.

According to one embodiment of the present disclosure, the low-contact-resistance material layer 940 surrounds the P-type metal electrode 960 completely or partially.

According to one embodiment of the present disclosure, the low-contact-resistance material layer is in a round-hole pattern, a stripe pattern, a lattice pattern, or a combination thereof.

According to one embodiment of the present disclosure, the material of the low-contact-resistance material layer graphene or a metal is selected from the group comprising of nickel (Ni), gold (Au), chromium (Cr), platinum (Pt), rhodium (Rh), titanium (Ti), aluminum (Al), silver (Ag), copper (Cu) and the combinations thereof.

According to one embodiment of the present disclosure, the thickness of the low-contact-resistance material layer is in a range of 0.1 nm to 1000 nm.

Although embodiments of the present disclosure and their advantages have been described in detail, they are not used to limit the present disclosure. It should be understood that various changes, substitutions and alterations can be made herein without departing from the spirit and scope of the present disclosure. Therefore, the protecting scope of the present disclosure should be defined as the following claims.

What is claimed is:

1. A light-emitting diode comprising:
an N-type metal electrode;
an N-type semiconductor layer contacting the N-type metal electrode;
a P-type semiconductor layer;
a light-emitting layer sandwiched between the N-type semiconductor layer and the P-type semiconductor layer;
a low-contact-resistance material layer positioned on a part of the P-type semiconductor layer;
a transparent conductive layer covering the low-contact-resistance material layer and the P-type semiconductor layer;
a P-type metal electrode positioned on the transparent conductive layer; and
a metal-indium contact layer positioned between the P-type semiconductor layer and the transparent conductive layer, wherein the low-contact-resistance material layer is embedded in the metal-indium contact layer and protrudes above a surface of the metal-indium contact layer into the transparent conductive layer.

2. The light-emitting diode of claim 1, wherein the N-type semiconductor layer comprises a mesa structure having a first area and a second area, wherein the first area has a higher level than that of the second area, the light-emitting layer and the P-type semiconductor layer is formed on the first area, and the N-type metal electrode is positioned on the second area of the mesa structure.

3. The light-emitting diode of claim 1, wherein the low contact resistance layer surrounds the P-type metal electrode, or is positioned between vertical projection regions of the P-type metal electrode and the N-type metal electrode.

4. The light-emitting diode of claim 1, wherein the N-type metal electrode and the P-type metal electrode are positioned on two opposite sides of the light-emitting layer.

5. The light-emitting diode of claim 4, wherein the low-contact-resistance material layer completely or partially surrounds the P-type metal electrode.

6. The light-emitting diode of claim 1, wherein the low-contact-resistance material layer is in a round-hole pattern, a stripe pattern, a lattice pattern, or a combination thereof.

7. The light-emitting diode of claim 1, wherein the material of the low-contact-resistance material layer is graphene or a metal selected from the group comprising of nickel (Ni), gold (Au), chromium (Cr), platinum (Pt), rhodium (Rh), titanium (Ti), aluminum (Al), silver (Ag), copper (Cu) and the combinations thereof.

8. The light-emitting diode of claim 1, wherein the thickness of the low-contact-resistance material layer is in a range of 0.1 nm to 1000 nm.

9. The light-emitting diode of claim 1, wherein the metal-indium contact layer is an indium tin oxide (ITO) layer.

* * * * *